United States Patent [19]

Fouere et al.

[11] Patent Number: 5,293,516
[45] Date of Patent: Mar. 8, 1994

[54] MULTIPROBE APPARATUS

[75] Inventors: Jean-Claude Fouere, Poughkeepsie; Kyong-Min Kim, Hopewell Junction; Pavel Smetana, Poughkeepsie, all of N.Y.

[73] Assignee: International Business Machines Corporation, Armonk, N.Y.

[21] Appl. No.: 828,539

[22] Filed: Jan. 28, 1992

[51] Int. Cl.$^5$ ............................................. G01R 1/04
[52] U.S. Cl. .............................. 324/158 P; 324/158 F
[58] Field of Search ............... 324/72.5, 158 P, 158 F; 357/68, 72; 156/647, 659.1, 662; 439/482

[56] References Cited

U.S. PATENT DOCUMENTS

| | | | |
|---|---|---|---|
| 4,520,314 | 5/1985 | Asch et al. | 324/158 |
| 4,581,928 | 4/1986 | Johnson | 156/647 |
| 4,585,991 | 4/1986 | Reid et al. | 156/647 |
| 4,618,397 | 10/1986 | Shimizu et al. | 437/8 |
| 4,810,557 | 3/1989 | Blonder | 156/647 |
| 4,827,211 | 5/1989 | Strid et al. | 324/158 P |
| 4,894,612 | 1/1990 | Drake et al. | 324/158 P |
| 4,899,099 | 2/1990 | Mendenhall et al. | 324/72.5 |
| 4,943,719 | 7/1990 | Akamine et al. | 73/105 |
| 4,949,148 | 8/1990 | Bartelink | 357/72 |
| 4,961,052 | 10/1990 | Jada et al. | 324/158 P |
| 4,967,146 | 10/1990 | Morgan et al. | 324/158 T |
| 4,998,062 | 3/1991 | Ikeda | 324/72.5 |
| 5,034,685 | 7/1991 | Leedy | 324/158 |
| 5,055,780 | 10/1991 | Takagi et al. | 324/158 |
| 5,070,297 | 12/1991 | Kwon et al. | 324/158 |
| 5,077,598 | 12/1991 | Bartelink | 357/68 |
| 5,084,672 | 1/1992 | Ikeuchi et al. | 324/72.5 |
| 5,089,772 | 2/1992 | Hatoda et al. | 324/158 P |
| 5,096,535 | 3/1992 | Hawkins et al. | 156/647 |

FOREIGN PATENT DOCUMENTS 1-56161 6/1990 Japan.
158765 7/1991 Japan.

OTHER PUBLICATIONS

Paper on "Thin Film Hybrid Technology for On-Wafer Probing of Integrated Circuits" from Hybrid Circuit Technology dated Apr. 14, 1990.
Paper on "Design and Fabrication of a Monolithic High-Density Probe Card for High-Frequency On-Wafer Testing" by Soonil Hong, et al. presented at the International Electron Devices Meeting, Washington, D.C. Dec. 3-6, 1989 (sponsored by Electron Devices Society of IEEE).

Primary Examiner—Vinh Nguyen
Attorney, Agent, or Firm—Richard Lau

[57] ABSTRACT

A multiprobe apparatus for probing a device having a plurality of contacts includes a holder for holding the device in a fixed position; a plurality of electrically conducting elongated probes, each probe being adapted for electrical communication with a respective one of the contacts by tangential linear contact along the length of the probe; and a probe support for supporting the probes and for maintaining the probes in electrical communication with the contacts.

11 Claims, 5 Drawing Sheets

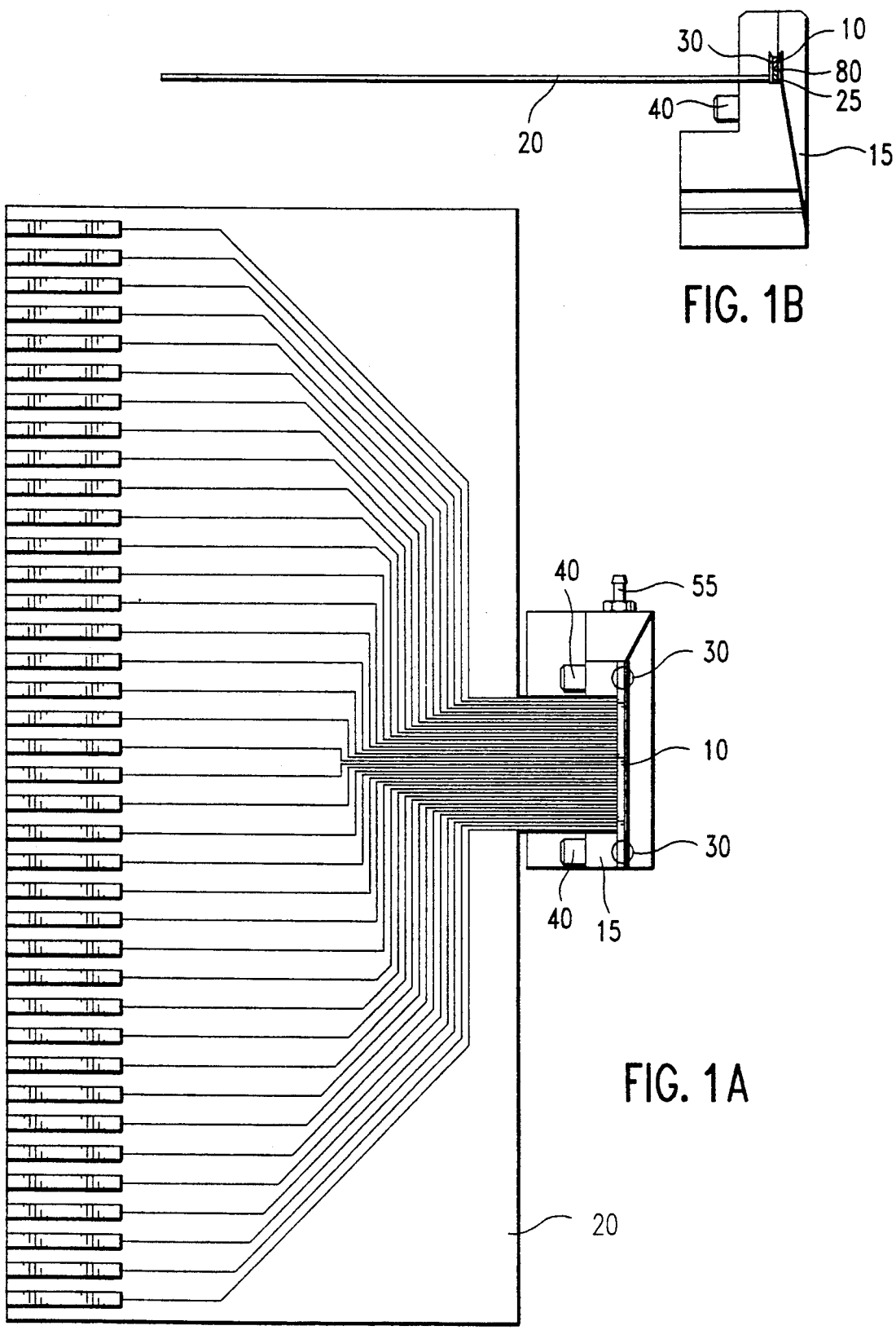

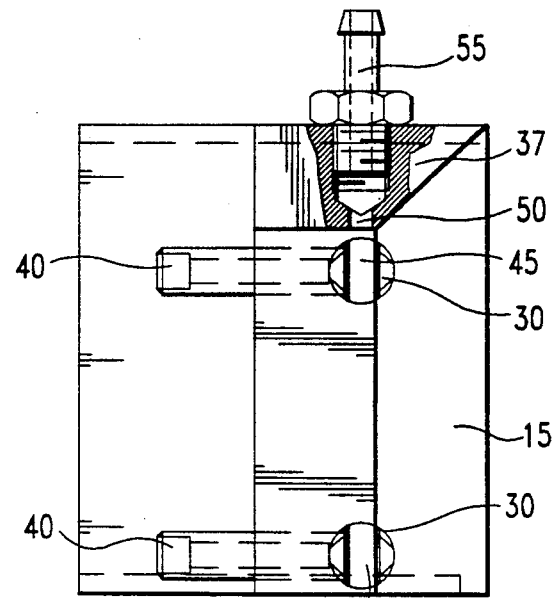
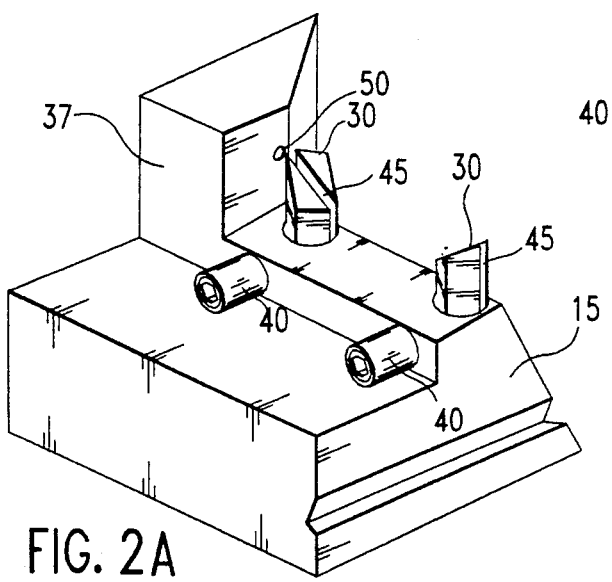
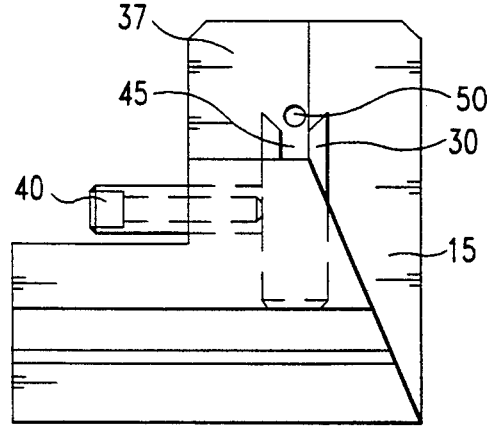
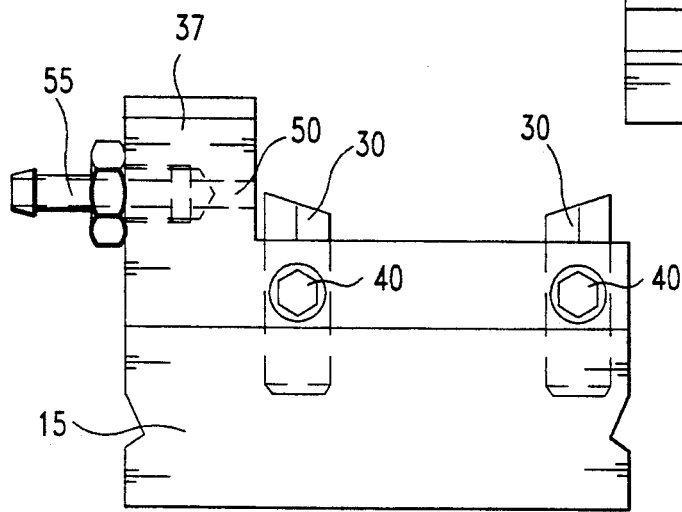
FIG. 2A
FIG. 2B
FIG. 2C
FIG. 2D

MULTIPROBE APPARATUS

TECHNICAL FIELD

The present invention relates generally to an apparatus for probing a device under test and, more particularly, to an apparatus for probing a device having a plurality of contacts, such as a laser bar which comprises a plurality of laser diodes.

BACKGROUND OF THE INVENTION

Semiconductor lasers or laser diodes have many advantages as compared to other types of lasers, such as solid-state, gas, or liquid lasers. Included among these advantages are the potential to be manufactured in high volume and at relatively low cost. Further, semiconductor lasers have electrical current requirements compatible with conventional semiconductor circuitry; and high voltage supplies or flash tubes are not required for operation of semiconductor lasers.

Gallium Arsenide (GaAs) is the semiconductor commonly used in the manufacture of semiconductor lasers, and the so-called Fabry-Perot cavity or interferometer is the commonly used resonant cavity in such lasers. A resonant cavity is a chamber having a size which reinforces energy injected therein at the natural frequency as determined by the chamber's dimensions. The resonant cavity is required in a semiconductor laser to provide positive feedback and quantum amplification. The Fabry-Perot cavity has a pair of perfectly aligned parallel mirror planes which are obtained by cleaving or polishing.

Semiconductor lasers, such as the Fabry-Perot type, are typically fabricated from a wafer, such as a heteroepitaxial wafer, which is cleaved into a plurality of parallel strips. These strips are referred to as laser bars. Each laser bar is subsequently diced into individual generally rectangular laser diodes. A typical laser diode may have a width of approximately 300 $\mu$m and a length of approximately 250–750 $\mu$m. Further, the specific quantity of laser diodes per each laser bar can vary considerably. For example, there can be anywhere between 32 and 64 laser diodes per laser bar. After dicing of the laser bar, each individual laser diode is appropriately packaged for implementation in an electronic device requiring such a diode.

Testing of each laser diode for proper operation before implementation in an electronic device is an important aspect of manufacturing. Specifically, the electrical and optical properties of each laser diode must be tested.

Conventionally, testing of laser diodes is conducted either after packaging of each individual diode or before packaging but after dicing of the laser bar into individual laser diodes. Testing after packaging is undesirable since a considerable amount of packaging time, packaging effort and packaging material is needlessly expended if it is ultimately determined that the laser diode is functioning improperly.

Testing before packaging but after dicing is also undesirable because use of existing test methods and equipment can be time consuming and frequently results in damage to the diodes. In this regard, each diode must be individually probed during testing. Typically, a tester employing a single probe is used to test individual laser diodes. Such testers are capable of probing and testing only one diode at a time, and thus such a testing scheme is inefficient and impractical, particularly when testing large quantities of diodes.

Further, laser diodes commonly utilize relatively soft metal contacts, such as gold contacts, for connecting to other components. These soft metal contacts are the contact points of the diodes that must be probed during testing. Probes employed in standard testers generally have sharp points and comprise relatively hard metal, such as barium copper, stainless steel, or the like. Frequently, these probes "dig" into the soft metal contacts of the diodes, thus causing extensive and irreparable damage to the contacts.

Another scheme proposed testing each laser diode before dicing the laser bar into individual diodes. Unfortunately, standard single probe testers require time consuming, inefficient and complicated indexing of the test probe to each diode of the laser bar in order to conduct the required tests. Although multiprobe type testers solve the indexing problems associated with single probe testers, it has proven difficult to manufacture a tester having a series of accurately and precisely spaced apart probes which correspond to the closely spaced apart contacts between adjacent diodes of a laser bar. In this regard, the distance between the contact of each diode on a laser bar may be on the order of approximately 300 $\mu$m or less. Moreover, the aforementioned problem of damaging the diode contacts still exists in these single probe and multiprobe testers used for testing before dicing of the laser bar.

SUMMARY OF THE INVENTION

It is therefore an object of the present invention to provide an apparatus for probing a device under test having a plurality of contacts.

It is another object of the present invention to provide an apparatus for simultaneously probing a plurality of contacts of a device under test.

It is yet a further object of the present invention to provide an apparatus for probing the contacts of a device without causing damage to the contacts of the device.

In order to accomplish the above and other objects of the invention, a multiprobe apparatus includes a holder for holding a device under test in a fixed position; a plurality of electrically conducting probes, each probe being in electrical contact with a respective one of the plurality of contacts of the device under test; and a probe support which comprises, for example, silicon having a plurality of grooves, each groove corresponding to a respective one of the contacts, and each groove having a respective one of the probes disposed therein for supporting the probes and for maintaining the probes in electrical communication with the contacts.

BRIEF DESCRIPTION OF THE DRAWINGS

These and other objects, features, aspects and advantages will be more readily apparent and better understood from the following detailed description of the invention, in which:

FIGS. 1A–B are top and side views of a laser bar being probed by a multiprobe apparatus in accordance with the present invention;

FIGS 2A–D are various views of a fixture employed in the multiprobe apparatus shown in FIGS. 1A–B;

DETAILED DESCRIPTION OF THE PREFERRED EMBODIMENTS

Figure 3A:
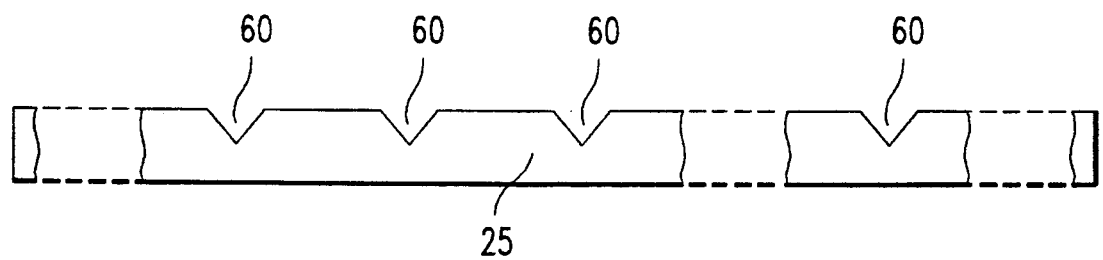
FIGS. 3A–C are various views of a probe support employed in the multiprobe apparatus shown in FIGS. 1A–B.

Referring initially to FIGS. 1A-B, there is shown a multiprobe apparatus of the present invention with a laser bar 10 suitably positioned thereon for being probed and tested. The laser bar 10 is shown herein as one example of a device to be probed. However, it should be understood that the multiprobe apparatus of the present invention can be used for any device having a plurality of contacts that require probing. The multiprobe apparatus includes a fixture 15, a printed circuit (PC) board 20, a probe support 25, pins 30, set screws 40 and probes 80. As will be described in more detail hereinafter, the contacts of the laser bar 10 are each contacted or probed by a probe 80 which provides an electrical connection between each contact and the PC board 20. The PC board 20 connects to other equipment, such as a current source, as may be required for conducting tests on the laser bar 10.

As shown in greater detail in FIGS. 2A-D, the pins 30 are held in position within the fixture 15 by the set screws 40. Illustratively, the pins 30 can comprise stainless steel, the fixture 15 can comprise brass, and the set screws 40 can comprise stainless steel, but other similar material can also be used to form these components. The set screws 40 allow for height adjustment of the pins 30 within the fixture 15. Each of the pins 30 has a groove 45 which is of suitable depth and width for allowing the probe support 25 and the laser bar 10 to be fitted therein. Further, a vacuum hole 50 extends through a wall 37 of the fixture 15. The vacuum hole 50 is positioned adjacent to the pins 30 and includes a vacuum fitting 55 connected thereto. During probing, the probe support 25 and/or the laser bar 10 abut(s) the fixture 15 at the vacuum hole 50, and the vacuum fitting 55 connects to a vacuum source (not shown) so that vacuum can be provided through the vacuum hole 50 for holding the probe support 25 and/or the laser bar 10 in an appropriate fixed position for probing. In this regard, if both the probe support 25 and the laser bar 10 are to be held in position by vacuum, then the vacuum hole 50 should be of sufficient size so that at least a portion of each of these components can be positioned against the vacuum hole 50. The amount of vacuum required for holding these components in a fixed position depends on the size and material of the device being probed and the probe support 25.

Figure 3B:
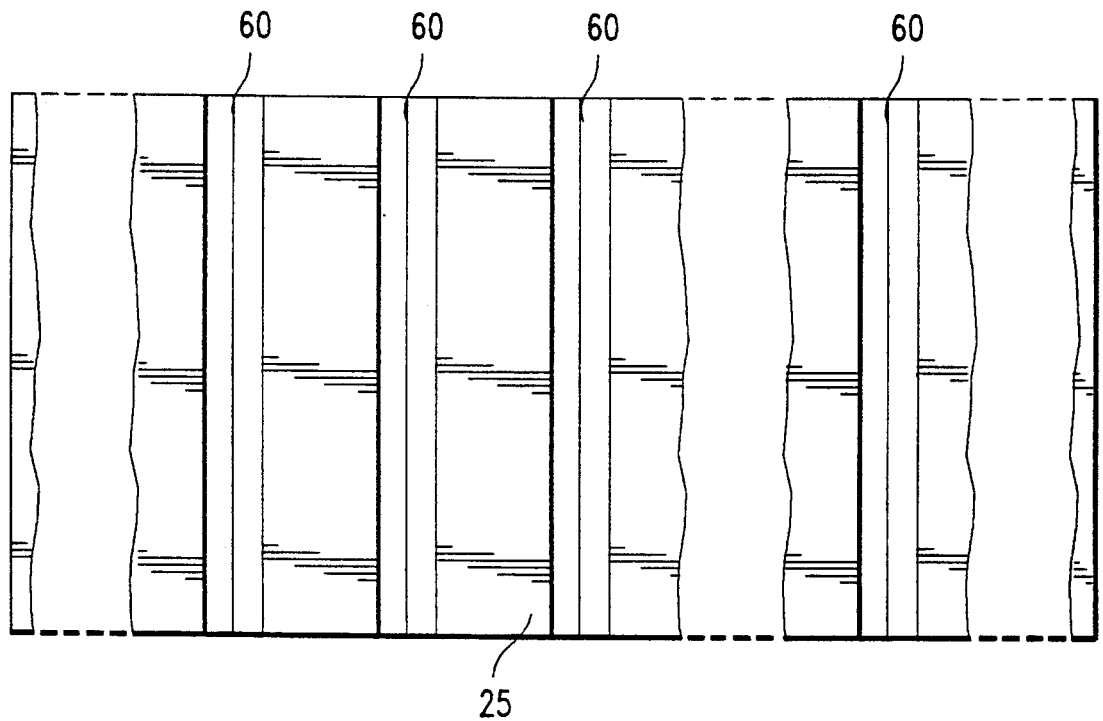
Figure 3C:
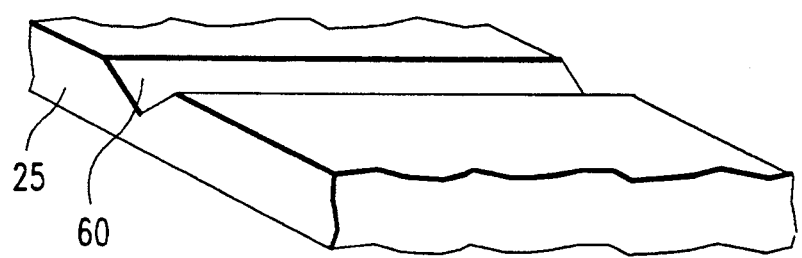
Figure 5:
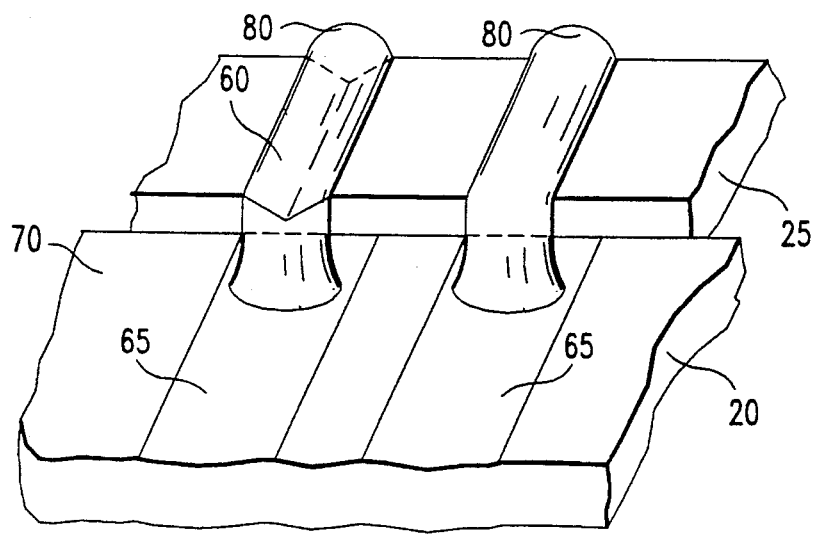
FIG. 5 is an enlarged perspective view of probes as connected to the probe support and printed circuit board.

Referring now to FIGS. 3A-C, the probe support 25 includes a plurality of grooves 60, each of which corresponds to a respective contact of the laser bar 10. As shown in FIG. 5, although the specific shape of each groove 60 is not critical for the present invention, the shape should be adequate for maintaining a probe 80 in a fixed position therein so as to prevent shorting of adjacent probes 80. Additionally, the shape of each groove 60 should allow for the probe 80 to be sufficiently exposed above the surface of the probe support 25 so as to allow the probe 80 to maintain electrical communication with the contact of the laser bar 10. The particular layout of the grooves 60 as formed on the probe support 25 is dicated by and in accordance with the layout of the contacts of the laser bar 10. In this regard, since adjacent contacts of the laser bar 10 are spaced closely together, the probe support 25 preferably comprises a material on which the grooves 60 can be readily and easily formed with a high degree of precision and accuracy. It is further preferable that fabrication of the grooves 60 can be accomplished using conventional methods.

In a preferred embodiment, the probe support 25 comprises high resistivity P-type silicon or undoped Germanium. For example, silicon having resistivity of approximately 1000 ohm-cm and a thickness of approximately 2 mm can be used for the probe support 25. Further the grooves 60 are preferably V-shaped in cross-section. Advantageously, V-shaped grooves can be easily formed on silicon with a high degree of precision and accuracy by using a conventional etching method, such as a preferential etching method. Those skilled in the art will appreciate that a conventional potassium hydroxide (KOH) etch using a KOH concentration of 45%, a temperature of 80° C. and an etch rate of 0.8 $\mu$/min. can be used to form the V-shaped grooves on the silicon. Particularly, for example, if a silicon wafer having <100> orientation is used as the probe support 25, then a photoresist mask should be applied to the wafer so that the grooves will be formed along the <110> direction of the wafer. The KOH anisotropic etch will then result in a V-shaped groove having both of its sides along the (111) plane of the silicon wafer, and having an angle between its two sidewalls of approximately 70 degrees. Thus, the depth of the groove is geometrically defined or controlled by the groove width. Subsequent to formation of the grooves on the silicon wafer, a conventional oxidation step can be included in the fabrication of the probe support 25 so as to provide high surface resistance on the wafer to minimize crosstalk between probes during probing and testing of the individual laser diodes of the laser bar 10. Moreover, each groove 60 can be gold plated to enhance wire bonding of a probe therein. The thickness of the gold plating can be, for example, 3-5 um.

Figure 4:
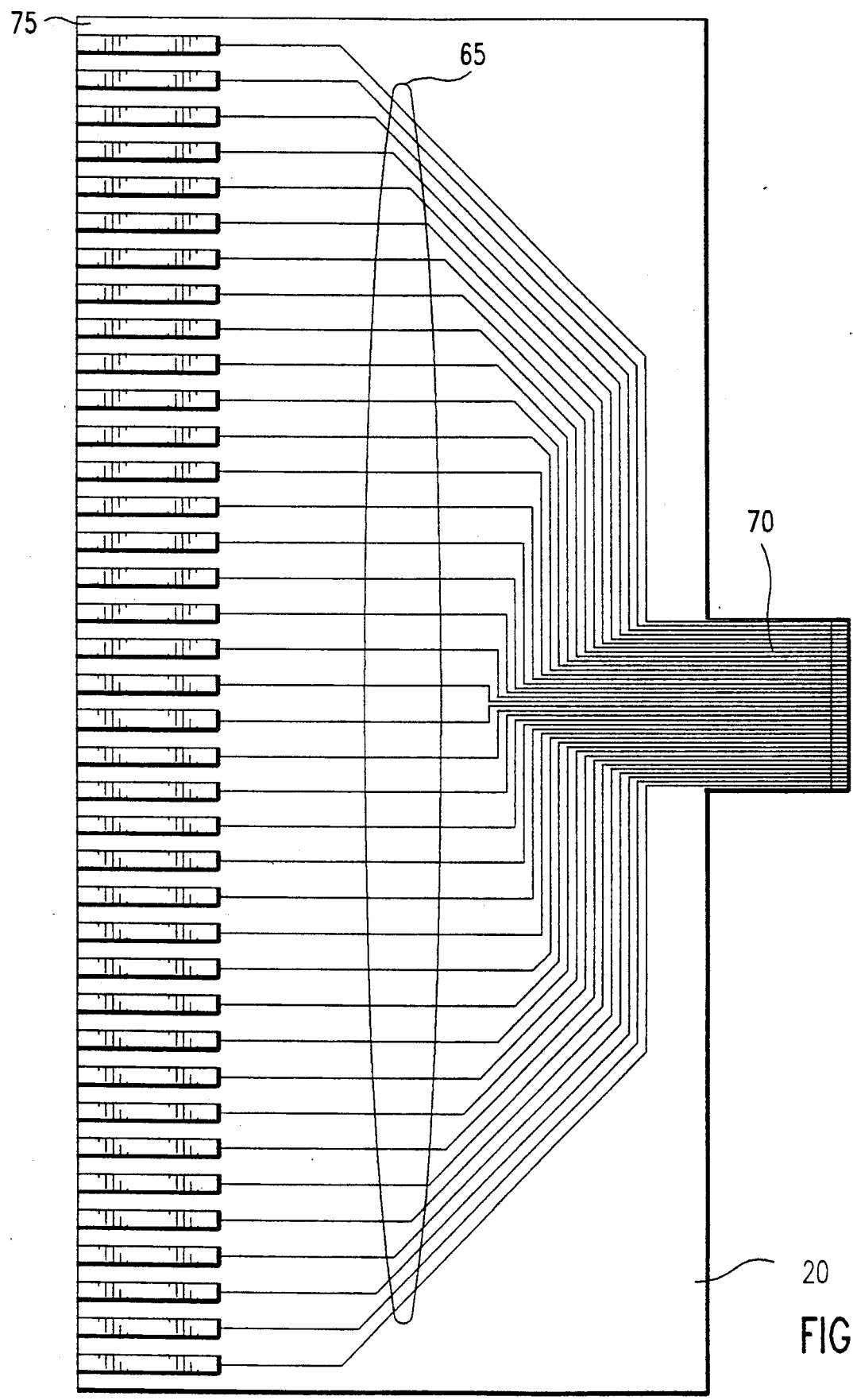
FIG. 4. is a printed circuit board employed in the multiprobe apparatus shown in FIGS. 1A-B.

The PC board 20 can be a conventional printed circuit board, such as of the gold plated type; and as shown in FIG. 4, the PC board 20 includes a plurality of lines 65 which correspond to the contacts of the laser bar 10 being probed. The lines 65 of the first end 70 of the PC board 20 are of adequately high density so as to correspond to the closely spaced grooves 60 of the probe support 25. Further, the lines 65 of the first end 70 should be of adequate width for allowing each line 65 to have a probe 80 connected thereto. The lines 65 of the second end 75 of the PC board 20 allow for connection to further test equipment, such as a current source, which may have for example standard single sided pin edge connectors.

Reference is now made to FIG. 5 which is an enlarged view of probes 80 and portions of the probe support 25 and PC board 20, particularly the first end 70 of the PC board 20. The probes 80 are supported by the probe support 25, and a partial cross-sectional view of one of the probes 80 illustrates how the probe 80 is disposed within the V-shaped groove 60 of the probe support 25. Each probe 80 is fixed within a respective groove 60 of the support 25, and each probe 80 also has one end connected to a respective line 65 of the first end 70 of the PC board 20. The probes 80 can be fixed within the grooves 60 and connected to the PC board 20 using conventional methods of wire bonding. Preferably, so as to prevent damage to the contacts of the device under test, the probes 80 should comprise a conductive material which is at least as soft as these contacts. Typically, laser diodes employ gold contacts and, therefore, the probes used for such devices can be fine gold wires. Gold wires having a diameter of approximately 100 um were found to adequately probe the laser diodes and to adequately fit into the V-shaped grooves of the silicon probe support described hereinabove.

Figure 6:
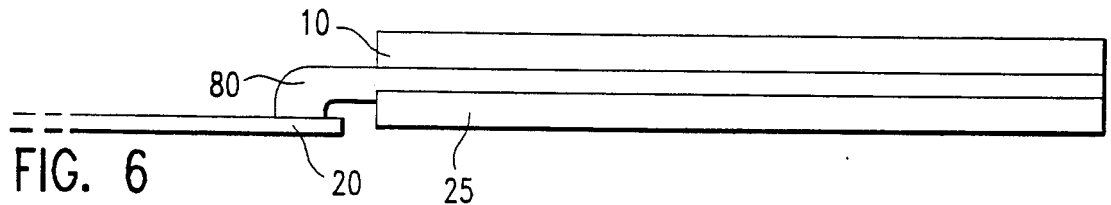
FIG. 6 is an enlarged side view of a probe connected to the printed circuit board and supported by the probe support, and illustrating probing of a laser bar.

As shown in FIG. 6, during probing, the probes 80 are situated or "sandwiched" between the laser bar 10 and the probe support 25 and retained by means of grooves 45 in pins 30. Since soft, fine probes, such as gold wires, tend to be somewhat limp, flexible and pliable, the probe support 25 provides the necessary support for maintaining the probes 80 in electrical communication with the contacts of the laser bar 10.

Moreover, as shown, the probes 80 are elongated wires which are of circular cross-section, and which electrically contact the contacts of the laser bar 10 by tangential linear contact along the length of the probe 80. Thus, each probe 80 needs to be aligned in only one dimension in order to properly contact the laser bar 10, and the area of contact between the probes 80 and the laser bar 10 is greatly increased in comparison to prior art point type probes.

Figure 7:
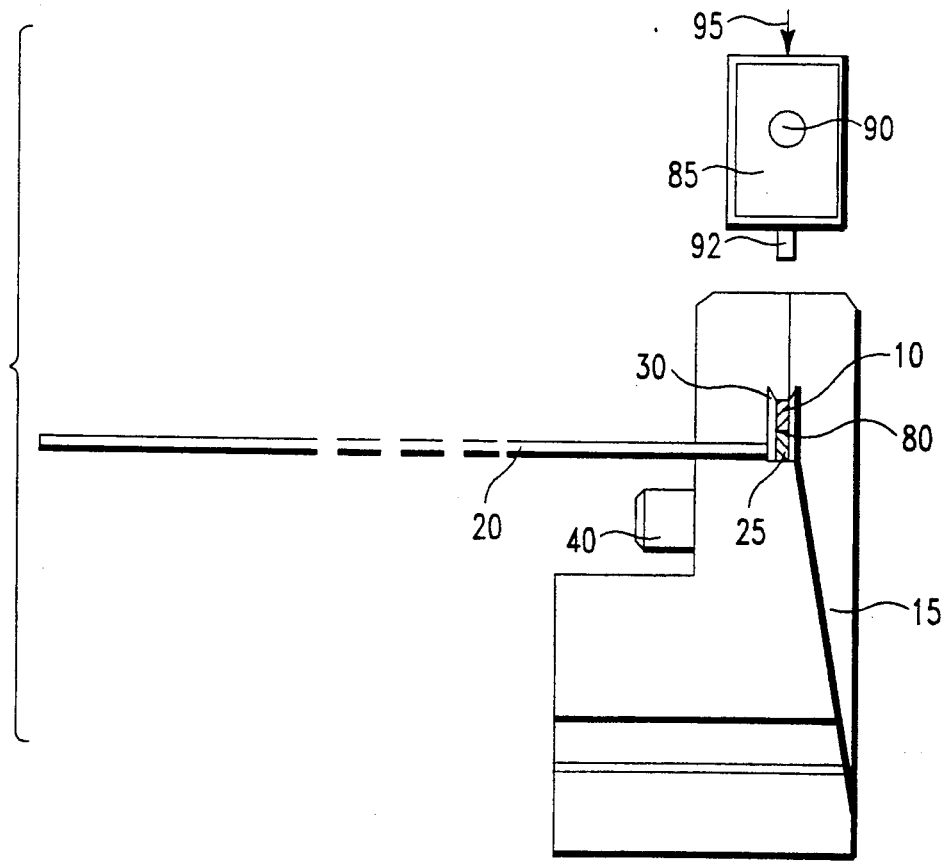
FIG. 7 is a side view of a laser bar being probed and tested utilizing the multiprobe apparatus of the present invention.

As an example, the multiprobe apparatus of the present invention can be used for conducting burn-in type tests on laser bars. Generally, burn-in testing of a laser bar involves controlled preliminary stress, electrical or thermal operation of each laser diode in order to determine if the electrical and optical characteristics of each diode meet required specifications. As shown in FIG. 7, current is applied to each laser diode via the probes 80 and PC board 20 by connecting a current source to the lines 65 of the PC board 20. Advantageously, the probing scheme of the present invention allows for simplified application of heat to and/or removal of heat from the laser bar 10 during or after testing. In this regard, a temperature controlled heatsink contact device 85 can be applied to the laser bar 10. The contact device 85 should include cooling means, which may be a temperature controlled liquid supplied via port 90 and returned via a similar port (not shown) which may be opposite the port 90. A contact 92, which is of substantially the same length as the laser bar 10, has a contact force or pressure applied thereto, as indicated by the arrow 95. The contact force 95 can be exerted by any conventional means and provides for adequate contact between the contact 92 and the laser bar 10 so that full thermal transfer is provided between the laser bar 10 and the heatsink device 85.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A multiprobe apparatus for probing a device having a plurality of contacts, comprising:
   a plurality of electrically conducting elongated probes, each probe comprising a wire of circular cross section, and each probe being adapted for electrical communication with a respective one of said contacts by tangential linear contact along the length of the probe;
   a probe support comprising a silicon wafer having <100> orientation, said silicon wafer having a plurality of grooves along the <110> direction, each groove corresponding to a respective one of said contacts, and each groove having a respective one of said probes disposed therein for supporting said probes and for maintaining said probes in electrical communication with said contacts; and
   holding means having a holding groove for fitting said device and said probe support with said probes therein, wherein said holding groove, in conjunction with the tangential linear contact of said probes with said contacts, allows said contacts to be properly contacted by said probes by alignment in one dimension.

2. A multiprobe apparatus according to claim 1, wherein said probes are sandwiched between said contacts and said probe support.

3. A multiprobe apparatus according to claim 1, wherein said grooves are V-shaped in cross section.

4. A multiprobe apparatus according to claim 1, wherein each of said grooves comprises two sidewalls along the (111) plane of said silicon wafer.

5. A multiprobe apparatus according to claim 1, wherein said probes comprise a material which is at least as soft as said contacts of said device.

6. A multiprobe apparatus according to claim 5, wherein said probes comprise gold.

7. A multiprobe apparatus according to claim 6, wherein said grooves are gold plated.

8. A multiprobe apparatus according to claim 1, wherein said probes are bonded into said grooves.

9. A multiprobe apparatus according to claim 1, wherein said holding means comprises vacuum means.

10. A multiprobe apparatus according to claim 1, further including temperature controlling means for controlling the temperature of the device.

11. A multiprobe apparatus according to claim 10, wherein said temperature controlling means comprises a heatsink having a temperature controlled liquid.

* * * * *